United States Patent
Luo et al.

(10) Patent No.: US 7,917,783 B2
(45) Date of Patent: Mar. 29, 2011

(54) POWER SWITCH DEVICE

(75) Inventors: Zi-Gui Luo, Shanhai (CN); Hai-Yi Ji, Shanhai (CN); Chih-Feng Chen, Taipei (TW)

(73) Assignee: Inventec Corporation, Taipei City (TW)

( * ) Notice: Subject to any disclaimer, the term of this patent is extended or adjusted under 35 U.S.C. 154(b) by 567 days.

(21) Appl. No.: 12/009,702

(22) Filed: Jan. 22, 2008

(65) Prior Publication Data

US 2009/0066165 A1 Mar. 12, 2009

(30) Foreign Application Priority Data

Sep. 6, 2007 (TW) ................................ 96133192 A

(51) Int. Cl.
*G06F 1/00* (2006.01)
(52) U.S. Cl. ........................................ 713/310; 713/323
(58) Field of Classification Search .......... 713/300–320, 713/323, 330–340
See application file for complete search history.

(56) References Cited

U.S. PATENT DOCUMENTS

| | | | |
|---|---|---|---|
| 6,791,369 B1 * | 9/2004 | Hattori | 327/52 |
| 7,636,797 B2 * | 12/2009 | Melton | 710/9 |
| 2008/0222408 A1 * | 9/2008 | Li | 713/2 |
| 2010/0192160 A1 * | 7/2010 | Taylor et al. | 719/313 |

* cited by examiner

*Primary Examiner* — Clifford H Knoll
(74) *Attorney, Agent, or Firm* — Peter F. Corless; Steven M. Jensen; Edwards Angell Palmer & Dodge LLP

(57) ABSTRACT

The invention provides a power switch device for electronic systems equipped having a power module. The power switch device includes a first switch for activating a first signal, a second switch for activating a second signal, a logic judging module for receiving the first and second signals for logic algorithm processing, and a control module electrically connected to the electronic system and the logic judging module. The control module is adapted to generate and transmit on and off signals of the electronic system to the logic judging module. Further, the control module controls switching on the power module according to the off signal and the logic algorithm processing based on the first signal, and also controls switching off the power module according to the on signal and the logic algorithm processing based on the first and second signals.

10 Claims, 4 Drawing Sheets

POWER SWITCH DEVICE

BACKGROUND OF THE INVENTION

1. Field of the Invention

The present invention relates generally to a power switch device, and more particularly to a power switch device that switch on/off a power module of an electronic system according to logic judging result.

2. Description of Related Art

An enterprise server normally operates 24 hours a day. However, as a power button is protrudingly disposed at front panel of a server, the power button may be accidentally touched, thereby leading to unexpected shutdown of the server. To reduce such a risk, the power button can be disabled in BIOS, but functions of other buttons disposed at the front panel of the server are also disabled at the same time. Under some special circumstances where a server needs to be shut down and then restarted, the server must be restarted so as to enable the power button in BIOS. Then, the server can be shut down and started again by pressing the power button. The above-described complicated processes are not convenient for users to conduct operation.

Alternatively, a casing structure can be disposed at position of the power button for protecting the power button from being accidentally touched by users. However, the casing structure increases the cost. Also, under some special circumstances where the power button needs to be pressed, the casing structure must be removed and after the power button is pressed, the casing structure needs to be assembled again. If the casing structure is not suitably disposed at position, the power button may also be accidentally touched or damaged. Therefore, the casing structure is also not convenient for users to conduct operation.

Therefore, there is a need to provide a power switch device that can prevent accidental touch of the power button and facilitate operation of the power switch.

SUMMARY OF THE INVENTION

Accordingly, an objective of the present invention is to provide a power switch device that can efficiently prevent accidental touch of the power button and accordingly prevent unexpected power off.

Another objective of the present invention is to provide a power switch device that can facilitate operation of power on and off.

In order to attain the above and other objectives, the present invention provides a power switch device for an electronic system having a power module. The power switch device of the present invention comprises a first switch for activating a first signal; a second switch for activating a second signal; a logic judging module electrically connected to the first switch and the second switch for receiving the first signal and the second signal so as to perform logic algorithm processing; and a control module electrically connected to the electronic system and the logic judging module for generating an on or off signal corresponding to the on or off state of the electronic system, transmitting the on or off signal to the logic judging module, switching on the power module according to the off signal and logic algorithm processing based on the first signal, and switching off the power module according to the on signal and the logic algorithm processing based on the first signal and the second signal.

According to the present invention, the logic judging module performs logic judgment according to the first signal generated by the first switch when the electronic system stays is off, and transmits the result of the logic judgment to the control module such that the control module generates a control signal. On the other hand, when the electronic system is on, the first signal generated by the first switch, the second signal generated by the second switch and the on signal generated by the control module are logically judged by the logic judging module and the result is transmitted to the control module such that the control module generates a control signal to control the power module of the electronic system.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

Figure 1:
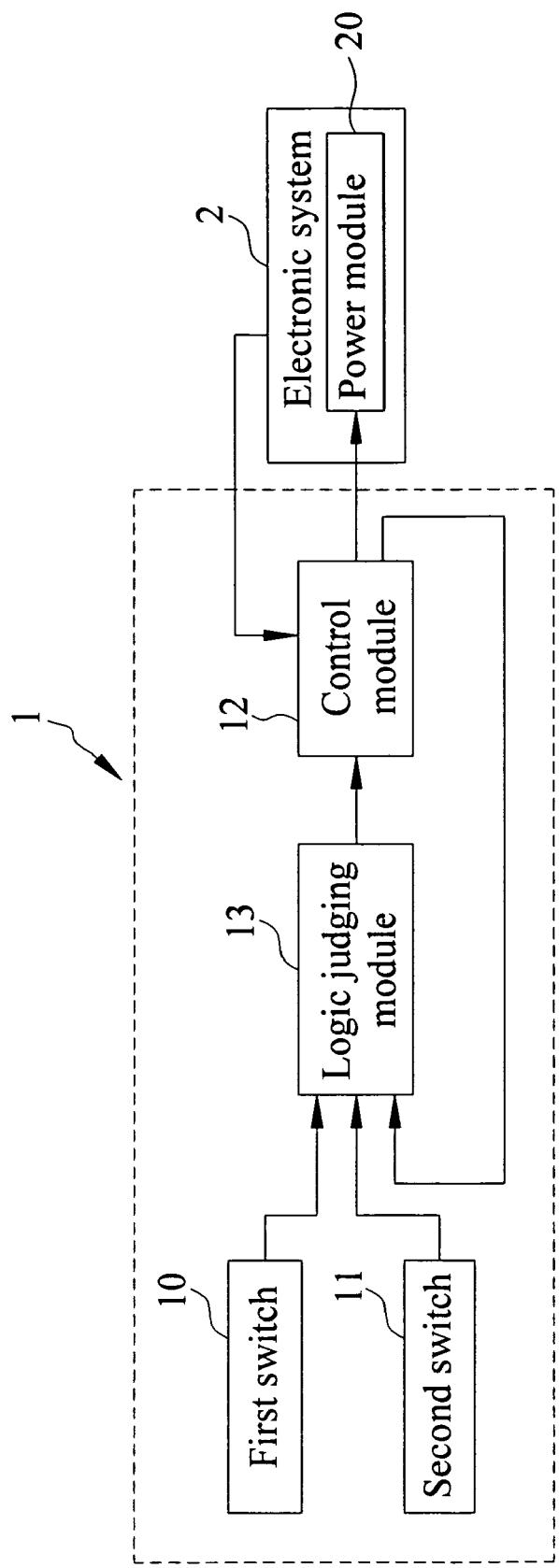
FIG. 1 is a block diagram of a power switch device according to the present invention.

FIG. 1 is a block diagram of a power switch device according to the present invention. The power switch device 1 of the present invention is applied to an electronic system 2 having a power module 20. The power switch device 1 includes a first switch 10, a second switch 11, a control module 12 and a logic judging module 13.

In the present embodiment, the first switch 10 can be such as a first power button for activating a first signal. The second switch 11 can be such as a second power button for activating a second signal. The control module 12 can be such as a south bridge chip electrically connected to the electronic system 2, the first switch 10 and the second switch 11. The control module 12 generates an on or off signal according to the on or off state of the electronic system 2, and generates a control signal according to the result of the logic algorithm processing performed by the logic judging module 13. Further, the control module 12 controls switching on or off the power module 20 according to the control signal. The logic judging module 13 can be such as a logic circuit electrically connected to the first switch 10, the second switch 11 and the control module 12 for receiving the first signal, the second signal, the on and off signal for logic algorithm processing.

If the electronic system 2 is off, the logic judging module 13 performs the logic judgment according to the first signal generated by the first switch 10 and transmits the result of the logic judgment to the control module 12; if the electronic system 2 is on, the logic judging module 13 performs logic judgment according to the first signal generated by the first switch 10, the second signal generated by the second switch 11 and the on signal generated by the control module 12 and transmits the result of the logic judgment to the control module 12. The control module 12 then generates a control signal corresponding to the logic judgment result so as to control switching on or off the power supply of the power module 20.

Figure 2:
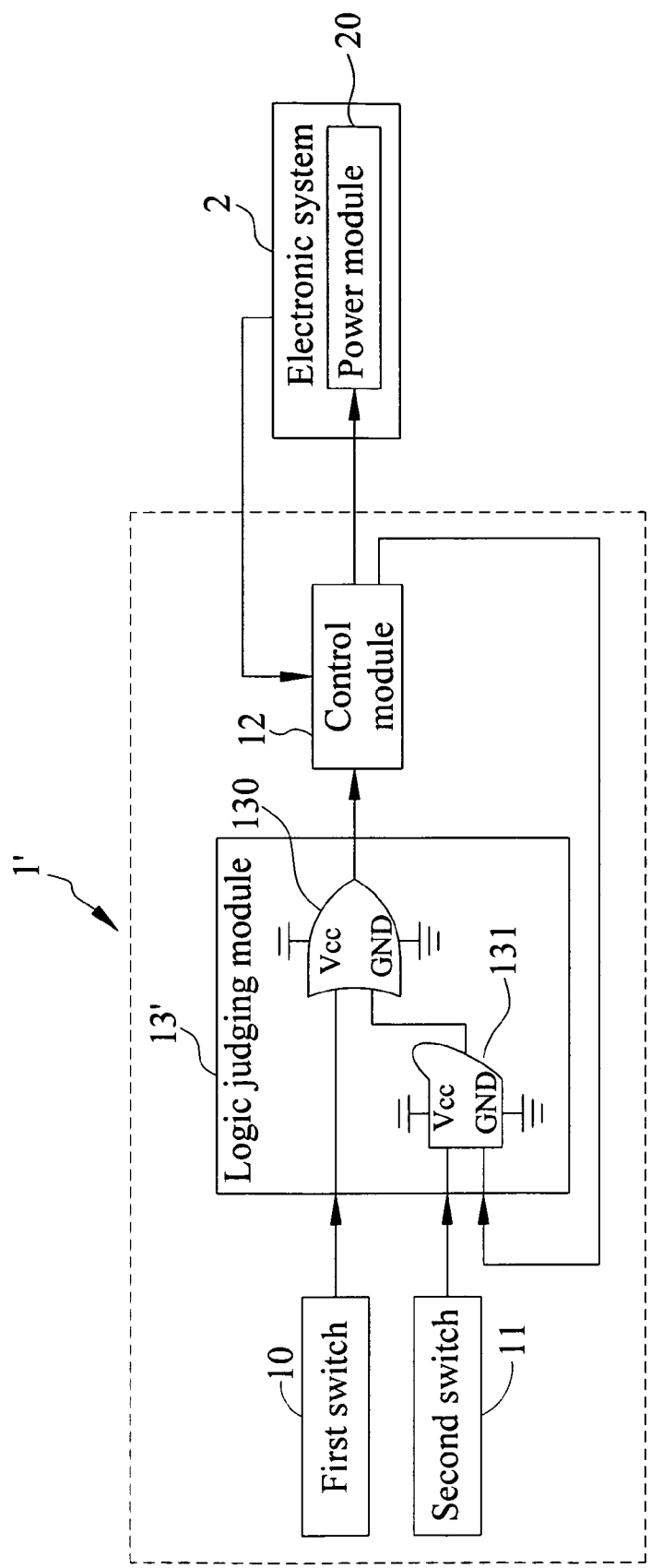
FIG. 2 is a schematic view showing a power switch device according to a first embodiment of the present invention.

FIG. 2 is a schematic view showing a power switch device according to a first embodiment of the present invention. The power switch device of FIG. 2 has a substantially same structure as that of FIG. 1 except the logic judging module 13' thereof. In the present embodiment, the logic judging module 13' is a logic circuit including an OR gate 130 and an AND gate 131. In light of the result of the logic algorithm processing performed by the logic judging module 13', the power module 20 of the electronic system 2 is controlled to be on or off.

More specifically, the power module 20 of the present embodiment switches on or off the power supply after receiving a low-level signal (that is, the control signal is '0') from the control module 12. That is, the low-level signal is an activation signal for power supply of the power module 20. The control module 12 transmits a signal (an on or off signal) corresponding to the on or off state of the electronic system 2 back to the logic judging module 13. For example, if the electronic system 2 is on, the control module 12 transmits a high-level signal (that is, an on signal of '1') to the AND gate 131 to be an input signal; on the other hand, if the electronic system 2 is off, the control module 12 transmits a low-level signal (that is, an off signal of '0') to the AND gate 131 to be an input signal.

As described above, if the electronic system 2 is off, the control module 12 transmits a low-level signal (an off signal '0') to the AND gate 131. At this time, if users want to start up the electronic system 20, the control module 12 should transmit a low-level signal (that is, a control signal of '0') to the power module 20 so as to activate the power module 20. Therefore, users only need to activate the first switch 10 by, for example, pressing the power button so as to generate a low-level first signal (that is, signal '0'). Generally, the first switch 10 is connected to a pull low resistor in series. In general circumstances where the first switch 10 is not activated, since the first switch 10 is not grounded and outputs a high-level signal, the high-level signal is transmitted to the OR gate 130. As a result, the control module 12 cannot be activated to control switching on or off the power module 20. On the other hand, when the first switch 10 is activated such as by pressing, the first switch 10 is grounded and outputs a low-level signal, and a low-level signal is transmitted to the OR gate 130. It depends on the state of the electronic system 2 whether the OR gate 130 can output a low-level signal.

If the electronic system 2 is off, input terminal of the AND gate 131 receives a low-level signal (an off signal of '0') from the control module 12. As a result, the AND gate 131 outputs a low-level signal to the OR gate 130. In other words, if the first switch 10 is activated, the first switch 10 outputs a low-level signal to the OR gate 130. As both input terminals of the OR gate 130 receive the low-level signals, the OR gate 130 outputs a low-level signal to the control module 12. Thus, the control module 12 activates the power module 20 according to the low-level signal so as to switch on the power module 20. Accordingly, the electronic system 2 is switched from the off state to the on state. At this point, the control module 12 transmits a high-level signal (on signal of '1') to input terminal of the AND gate 131 according to the on state of the electronic system 2. For the electronic system 2 being on, if neither the first switch 10 nor the second switch 11 is activated, the logic judging module 13' including the OR gate 130 and the AND gate 131 continuously outputs a high-level signal, and the electronic system 2 continuously obtains power supply from the power module 20 and keeps being on.

On the other hand, if users would like to shut down the electronic system 2, the control module 12 should receive a low-level signal from the logic judging module 13' so as to activate the power module 20 to switch off the power supply. Therefore, users need to press the first switch 10 and the second switch 11 at the same time such that both the first and second switches 10, 11 respectively generate and transmit low-level signals to the OR gate 130 and the AND gate 131. Therefore, the logic judging module 13' outputs and transmits a low-level signal to the control module 12. Accordingly, the control module 12 generates a low-level control signal so as to activate the power module 20 to shut down the power supply. Since the electronic system 2 is switched from on state to off state, the control module 12 further transmits a low-level signal (off signal) back to the logic judging module 13' to be a logic reference for the next switching on/off.

Therefore, the power switch device of the present invention shuts down the power supply according to operation states of the two power switches so as to efficiently prevent accidental touch of the power button and unexpected shutdown of the power supply.

Figure 3:
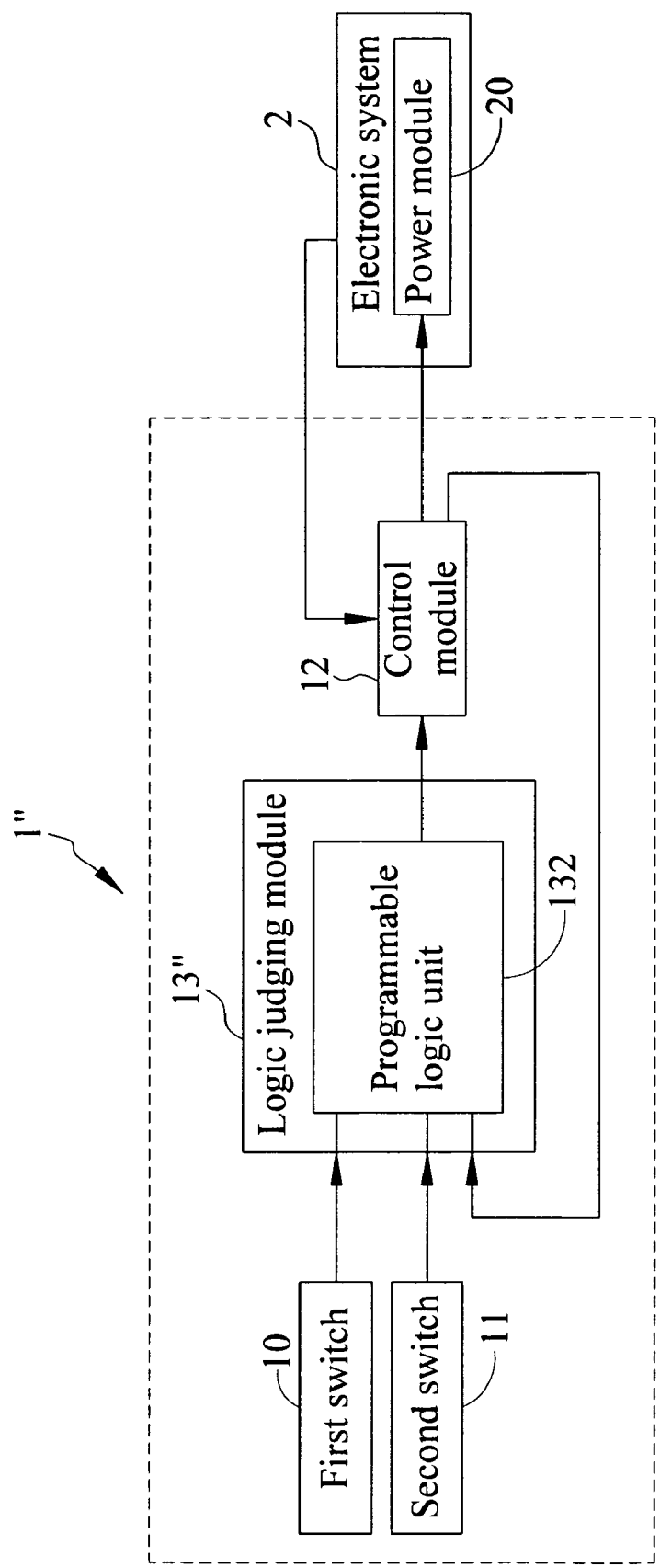
FIG. 3 is a schematic view showing a power switch device according to a second embodiment of the present invention.
Figure 4:
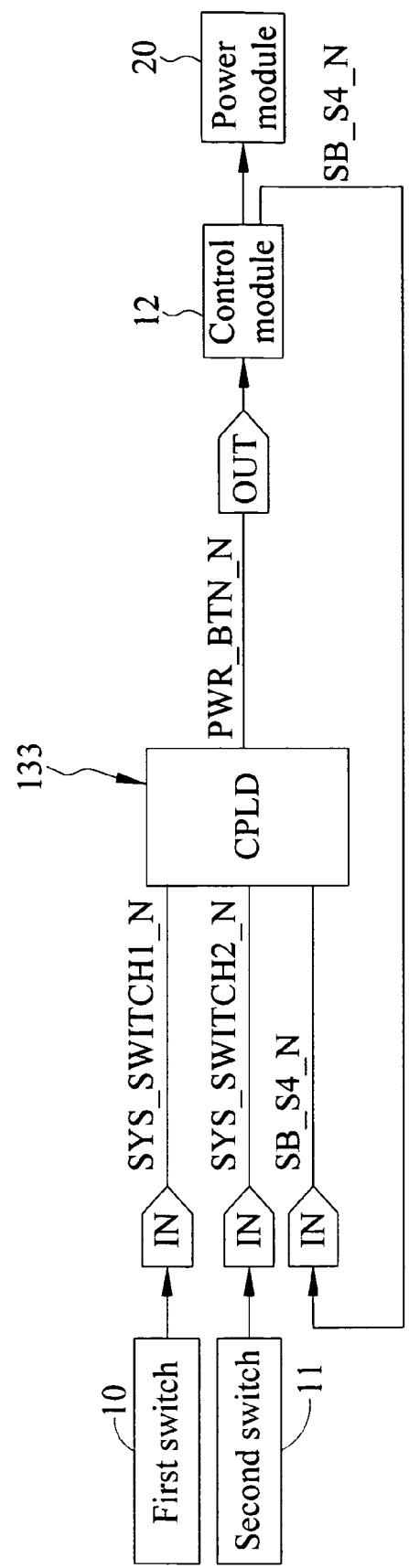
FIG. 4 is a schematic view showing a power switch device of FIG. 3 wherein a complex programmable logic device is used as the programmable logic unit.

FIG. 3 is a schematic view showing a power switch device according to a second embodiment of the present invention. The power switch device of FIG. 3 has a substantially same structure as that of FIGS. 1 and 2 except the logic judging module 13" thereof. In the present embodiment, the logic judging module 13" includes a programmable logic unit 132, which can be such as a complex programmable logic device (CPLD) or a field-programmable gate array (FPGA). In other words, the power module 20 is controlled through a programmable method. FIG. 4 shows input and output signals of a complex programmable logic device that is used as a programmable logic unit 132. The program of the complex programmable logic device is shown as follows.

```
module PWRBTN(
    SYS_SWITCH1_N,
    SYS_SWITCH2_N,
    SB_S4_N,
    PWR_BTN_N
);
    input SYS_SWITCH1_N;
    input SYS_SWITCH2_N;
    input SB_S4_N;
    output PWR_BTN_N;
    reg PWR_BTN_N;
    assign PWR_BTN_N = SYS_SWITCH1_N |
    (SYS_SWITCH2_N & SB_S4_N);
endmodule
``` in which, '|' represents logic OR, '&' represent logic AND, SYS_SWITCH1_N is corresponding to the first signal generated by the first switch 10, SYS_SWITCH2_N is corresponding to the second signal generated by the second switch 11, SB_S4_N is corresponding to the on or off signal generated by the control module 12. The design principle is same as that in FIG. 2 such that detailed description thereof is omitted.

According to the present invention, the logic judging module performs logic judgment according to the first signal generated by the first switch when the electronic system is off, and transmits the result of the logic judgment to the control module such that the control module generates a control signal to for the power module to supply power. Thus, the electronic system is switched from the off state to the on state, and the control module outputs an on signal to the logic judging module for subsequent logic algorithm processing such that the control module controls switching on or off the power module. On the other hand, when the electronic system is on, the first signal generated by the first switch, the second signal generated by the second switch and the on signal generated by the control module are logically judged by the logic judging module and the result is transmitted to the control module such that the control module generates a control signal which is further transmitted to the power module 20 of the electronic system 2. Thus, the start and shutdown of the electronic system can be controlled through the result of logic judgment, and accidental touch of the power button and unexpected shutdown of the electronic system can be prevented.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A power switch device for an electronic system having a power module, the power switch device comprising:
   a first switch for activating a first signal;
   a second switch for activating a second signal;
   a south bridge chip for generating an on or off signal corresponding to an on or off state of the electronic system; and
   a logic judging module electrically connected to the first switch, the second switch, and the south bridge chip for receiving the first signal, the second signal, and the on or off signal of the electronic system, and transmitting a control signal to the south bridge chip,
   wherein when the electronic system is off, the south bridge chip transmits the off signal, and if the logic judging module receives the first signal and the off signal, then the south bridge chip switches on the power module according to the control signal so as to switch on the electronic system, and
   when the electronic system is on, the south bridge chip transmits the on signal, and if the logic judging module receives the first signal, the second signal, and the on signal, then the south bridge chip switches off the power module according to the control signal so as to switch off the electronic system.

2. The power switch device of claim 1, wherein the logic judging module is a logic circuit.

3. The power switch device of claim 2, wherein the logic circuit comprises a logic OR gate and a logic AND gate, an input terminal of the OR gate being connected to an output terminal of the AND gate, another input terminal of the OR gate receiving the first signal, two input terminals of the AND gate respectively receiving the second signal, the on signal, and the off signal, and an output terminal of the OR gate transmitting the control signal,
   wherein if the electronic system is off, the input terminals of the AND gate respectively receive the second signal and the off signal, and if the electronic system is on, the input terminals of the AND gate respectively receive the second signal and the on signal.

4. The power switch device of claim 1, wherein the logic judging module is a programmable logic unit.

5. The power switch device of claim 4, wherein the programmable logic unit is one of a complex programmable logic device and a programmable logic gate array.

6. The power switch device of claim 4, wherein the programmable logic unit is a complex programmable logic device for receiving the first signal, the second signal, and the on and off signals.

7. The power switch device of claim 1, wherein the first switch and the second switch are respectively a first power button and a second power button,
   wherein when the electronic system is off, the first signal is activated by pressing the first power button so as to switch on the electronic system, and
   when the electronic system is on, the first signal and the second signal are respectively activated by pressing the first power button and the second power button so as to switch off the electronic system.

8. The power switch device of claim 1, wherein the south bridge chip generates the off signal corresponding to the electronic system when the power module is switched off.

9. The power switch device of claim 1, wherein the south bridge chip generates the on signal corresponding to the electronic system when the power module is switched on.

10. The power switch device of claim 1, wherein the first signal, the second signal and the control signal are low-level signals as activation signals, and the on signal and the off signal are respectively a high-level signal and the low-level signal.

* * * * *